US012666788B2

(12) United States Patent (10) Patent No.: US 12,666,788 B2
Hao et al. (45) Date of Patent: Jun. 23, 2026

(54) DISPLAY PANEL WITH IMPROVED DISPLAY EFFECT AND MANUFACTURING METHOD THEREFOR, AND DISPLAY APPARATUS

(71) Applicant: BOE TECHNOLOGY GROUP CO., LTD., Beijing (CN)

(72) Inventors: Yanjun Hao, Beijing (CN); Caiyu Qu, Beijing (CN); Xiaobo Du, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 436 days.

(21) Appl. No.: 18/260,876

(22) PCT Filed: Oct. 22, 2021

(86) PCT No.: PCT/CN2021/125642
§ 371 (c)(1),
(2) Date: Jul. 10, 2023

(87) PCT Pub. No.: WO2022/217881
PCT Pub. Date: Oct. 20, 2022

(65) Prior Publication Data
US 2024/0057368 A1 Feb. 15, 2024

(30) Foreign Application Priority Data
Apr. 12, 2021 (CN) .......................... 202110389793.0

(51) Int. Cl.
*H10K 50/15* (2023.01)
*H10K 59/35* (2023.01)
(Continued)

(52) U.S. Cl.
CPC ........... *H10K 50/156* (2023.02); *H10K 59/35* (2023.02); *H10K 71/60* (2023.02); *H10K 2101/40* (2023.02); *H10K 2102/351* (2023.02)

(58) Field of Classification Search
CPC ...... H10K 50/156; H10K 59/35; H10K 71/60; H10K 2101/40; H10K 2102/351;
(Continued)

(56) References Cited

U.S. PATENT DOCUMENTS

| | | | |
|---|---|---|---|
| 7,994,711 B2 * | 8/2011 | Nakamura | ........... H10K 59/131 313/506 |
| 9,893,124 B2 * | 2/2018 | Song | ...................... H10K 50/15 |

(Continued)

FOREIGN PATENT DOCUMENTS

| | | |
|---|---|---|
| CN | 101079471 A | 11/2007 |
| CN | 103872087 A | 6/2014 |

(Continued)

OTHER PUBLICATIONS

Chinese First Office Action & Search Report dated Apr. 19, 2022, relating to CN Patent Application No. 202110389793.0.
(Continued)

*Primary Examiner* — Chad M Dicke
*Assistant Examiner* — Jeremy Daniel Watts
(74) *Attorney, Agent, or Firm* — DINSMORE & SHOHL LLP

(57) ABSTRACT

A display panel and a manufacturing method therefor, and a display apparatus. The display panel includes: a hole transport layer; a buffer layer, including at least one of first and second buffer layers respectively in first and second subpixels; a light-emitting layer, HOMO energy level difference between the first light-emitting layer and the first hole transport layer being a first difference, and absolute value of HOMO energy level difference between the second light-emitting layer and the second hole transport layer being greater than 0 and less than the first difference; and a cathode. HOMO energy levels of first buffer sub-layers gradually increase in the direction from the first hole trans-
(Continued)

port layer to the first light-emitting layer. HOMO energy level difference between the second light-emitting layer and the second buffer layer or the second buffer layer and the second hole transport layer is greater than or equal to 0.3 eV.

20 Claims, 5 Drawing Sheets

(51) Int. Cl.
| | | |
|---|---|---|
| *H10K 71/60* | (2023.01) | |
| *H10K 101/40* | (2023.01) | |
| *H10K 102/00* | (2023.01) | |

(58) Field of Classification Search
CPC .... H10K 2101/30; H10K 50/11; H10K 50/15; H10K 71/00
See application file for complete search history.

(56) References Cited

U.S. PATENT DOCUMENTS

| | | | |
|---|---|---|---|
| 10,193,096 B2* | 1/2019 | Gao | H10K 50/171 |
| 2004/0004433 A1* | 1/2004 | Lamansky | H10K 85/111 |
| | | | 313/506 |
| 2008/0007170 A1* | 1/2008 | Kim | H10K 50/15 |
| | | | 257/E51.026 |
| 2014/0167013 A1 | 6/2014 | Lee et al. | |
| 2015/0155515 A1* | 6/2015 | Kim | H10K 50/11 |
| | | | 438/35 |
| 2016/0365528 A1 | 12/2016 | Tian | |
| 2018/0006090 A1 | 1/2018 | Leem et al. | |
| 2018/0026219 A1 | 1/2018 | Li et al. | |
| 2020/0161577 A1 | 5/2020 | Kang et al. | |
| 2020/0258949 A1 | 8/2020 | Li et al. | |
| 2020/0385412 A1 | 12/2020 | Wei et al. | |
| 2021/0013437 A1* | 1/2021 | Su | H10H 20/812 |
| 2021/0143356 A1 | 5/2021 | Zhang | |

FOREIGN PATENT DOCUMENTS

| | | |
|---|---|---|
| CN | 104167497 A | 11/2014 |
| CN | 106960862 A | 7/2017 |
| CN | 107644940 A | 1/2018 |
| CN | 108752320 A | 11/2018 |
| CN | 109473559 A | 3/2019 |
| CN | 109599413 A | 4/2019 |
| CN | 109879901 A | 6/2019 |
| CN | 110551132 A | 12/2019 |
| CN | 110970567 A | 4/2020 |
| CN | 110970568 A | 4/2020 |
| CN | 111211236 A | 5/2020 |
| CN | 111816690 A | 10/2020 |
| CN | 113130805 A | 7/2021 |
| JP | 2019009331 A | 1/2019 |

OTHER PUBLICATIONS

Chinese Second Office Action & Search Report dated Nov. 3, 2022, relating to CN Patent Application No. 202110389793.0.
International Search Report & Written Opinion relating to PCT/CN2021/125642 filed Oct. 22, 2021; Mail Date: Jan. 24, 2022.

* cited by examiner 111    211    121    131    141    22    23    15

112    212    122    132    142    22    23    15

113    213    123    133    143    22    23    15

DISPLAY PANEL WITH IMPROVED DISPLAY EFFECT AND MANUFACTURING METHOD THEREFOR, AND DISPLAY APPARATUS

CROSS-REFERENCE TO RELATED APPLICATIONS

The present application is a U.S. National Stage Application under 35 U.S.C. § 371 of International Patent Application No. PCT/CN2021/125642, filed on Oct. 22, 2021, which claims priority to China Patent Application 202110389793.0 filed on Apr. 12, 2021, the disclosures of both of which are incorporated by reference herein in their entireties.

TECHNICAL FIELD

The present disclosure relates to a display panel and a manufacturing method therefor, and a display apparatus.

BACKGROUND

In recent years, the display technology based on OLED (Organic Light-Emitting Diode) gradually attracted more attention.

Since OLED has the characteristics of active light-emission, high luminance, high resolution, wide viewing angle, fast response, low energy consumption and flexibility, the display technology based on OLED may replace the liquid crystal display technology as the next generation of display technology.

SUMMARY

According to an aspect of the embodiments of the present disclosure, a display panel is provided. The display panel comprises a plurality of sub-pixels located on a base substrate, the plurality of sub-pixels comprising a first sub-pixel and a second sub-pixel. The display panel comprises: an anode layer comprising a first anode located in the first sub-pixel and a second anode located in the second sub-pixel; a hole transport layer located on one side of the anode layer away from the base substrate, and comprising a first hole transport layer located in the first sub-pixel and a second hole transport layer located in the second sub-pixel; a buffer layer located on one side of the hole transport layer away from the base substrate, and comprising at least one of a first buffer layer located in the first sub-pixel or a second buffer layer located in the second sub-pixel; a light-emitting layer located on one side of the buffer layer away from the base substrate, and comprising a first light-emitting layer located in the first sub-pixel and a second light-emitting layer located in the second sub-pixel, wherein Highest Occupied Molecular Orbital (HOMO) energy level difference between the first light-emitting layer and the first hole transport layer is a first difference greater than 0, and an absolute value of HOMO energy level difference between the second light-emitting layer and the second hole transport layer is a second difference greater than 0 and smaller than the first difference; and a cathode located on one side of the light-emitting layer away from the anode layer. The first buffer layer comprises a plurality of first buffer sub-layers, and HOMO energy level of each of the plurality of first buffer sub-layers is located between HOMO energy level of the first light-emitting layer and HOMO energy level of the first hole transport layer, and HOMO energy levels of the plurality of first buffer sub-layers gradually increase in a direction from the first hole transport layer to the first light-emitting layer. HOMO energy level of the second buffer layer is located between HOMO energy level of the second light-emitting layer and HOMO energy level of the second hole transport layer, and HOMO energy level difference between the second light-emitting layer and the second buffer layer is a third difference, and HOMO energy level difference between the second buffer layer and the second hole transport layer is a fourth difference, wherein one of the third difference and the fourth difference is greater than or equal to 0.3 eV.

In some embodiments, the plurality of sub-pixels further comprises a third sub-pixel, wherein: the anode layer further comprises a third anode located in the third sub-pixel; the hole transport layer further comprises a third hole transport layer located in the third sub-pixel; the buffer layer further comprises a third buffer layer located in the third sub-pixel; and the light-emitting layer further comprises a third light-emitting layer located in the third sub-pixel, and HOMO energy level difference between the third light-emitting layer and the third hole transport layer is a fifth difference greater than 0 and smaller than the first difference, wherein HOMO energy level of the third buffer layer is located between HOMO energy level of the third light-emitting layer and HOMO energy level of the third hole transport layer, HOMO energy level difference between the third light-emitting layer and the third buffer layer is a sixth difference, and HOMO energy level difference between the third buffer layer and the third hole transport layer is a seventh difference, wherein one of the sixth difference and the seventh difference is greater than or equal to 0.3 eV.

In some embodiments, the first sub-pixel is a blue sub-pixel, and the second sub-pixel is one of a red sub-pixel and a green sub-pixel.

In some embodiments, at least one of the plurality of first buffer sub-layers has a thickness ranging from 2 nm to 10 nm.

In some embodiments, a first mobility of at least one of the plurality of first buffer sub-layers is greater than or equal to $10^{-6}$ cm2/V·s.

In some embodiments, the first mobility is smaller than or equal to $10^{-2}$ cm2/V·s.

In some embodiments, at least one of the second buffer layer or the third buffer layer has a thickness ranging from 30 nm to 100 nm.

In some embodiments, a second mobility of at least one of the second buffer layer or the third buffer layer is greater than or equal to $10^{-4}$ cm2/V·s.

In some embodiments, the second mobility is smaller than or equal to $10^{-2}$ cm2/V·s.

In some embodiments, a branched chain of each of the plurality of first buffer sub-layers contains a first electron donating group, and a branched chain of each of the second buffer layer and the third buffer layer contains one of a second electron donating group and an electron withdrawing group, wherein an electron donating ability of the second electron donating group is greater than an electron donating ability of the first electron donating group.

In some embodiments, the one of the third difference and the fourth difference is smaller than or equal to 0.7 eV.

In some embodiments, the one of the sixth difference and the seventh difference is smaller than or equal to 0.7 eV.

In some embodiments, the first hole transport layer and the second hole transport layer are continuous.

In some embodiments, the display panel further comprises: a hole injection layer comprising a first hole injection layer located in the first sub-pixel and a second hole injection layer located in the second sub-pixel.

In some embodiments, the first hole injection layer and the second hole injection layer are continuous.

According to another aspect of the embodiments of the present disclosure, a display apparatus is provided. The display apparatus comprises the display panel according to any of the above embodiments.

According to a further aspect of the embodiments of the present disclosure, a manufacturing method of a display panel is provided. The display panel comprises a plurality of sub-pixels located on a base substrate, and the plurality of sub-pixels comprises a first sub-pixel and a second sub-pixel. The manufacturing method comprises: providing a backplane, the backplane comprising an anode layer located on the base substrate, the anode layer comprising a first anode located in the first sub-pixel and a second anode located in the second sub-pixel; forming a hole transport layer on one side of the anode layer away from the base substrate, the hole transport layer comprising a first hole transport layer located in the first sub-pixel and a second hole transport layer located in the second sub-pixel; forming a buffer layer on one side of the hole transport layer away from the base substrate, the buffer layer comprising at least one of a first buffer layer located in the first sub-pixel or a second buffer layer located in the second sub-pixel; forming a light-emitting layer on one side of the buffer layer away from the base substrate, the light-emitting layer comprising a first light-emitting layer located in the first sub-pixel and a second light-emitting layer located in the second sub-pixel, wherein HOMO energy level difference between the first light-emitting layer and the first hole transport layer is a first difference greater than 0, and an absolute value of HOMO energy level difference between the second light-emitting layer and the second hole transport layer is a second difference greater than 0 and smaller than the first difference; and forming a cathode on one side of the light-emitting layer away from the anode layer. The first buffer layer comprises a plurality of first buffer sub-layers, and HOMO energy level of each of the plurality of first buffer sub-layers is located between HOMO energy level of the first light-emitting layer and HOMO energy level of the first hole transport layer, and HOMO energy levels of the plurality of first buffer sub-layers gradually increase in a direction from the first hole transport layer to the first light-emitting layer. HOMO energy level of the second buffer layer is located between HOMO energy level of the second light-emitting layer and HOMO energy level of the second hole transport layer, and HOMO energy level difference between the second light-emitting layer and the second buffer layer is a third difference, and HOMO energy level difference between the second buffer layer and the second hole transport layer is a fourth difference, wherein one of the third difference and the fourth difference is greater than or equal to 0.3 eV.

In some embodiments, the plurality of sub-pixels further comprises a third sub-pixel, wherein: the anode layer further comprises a third anode located in the third sub-pixel; the hole transport layer further comprises a third hole transport layer located in the third sub-pixel; the buffer layer further comprises a third buffer layer located in the third sub-pixel; and the light-emitting layer further comprises a third light-emitting layer located in the third sub-pixel, and HOMO energy level difference between the third light-emitting layer and the third hole transport layer is a fifth difference greater than 0 and smaller than the first difference, wherein HOMO energy level of the third buffer layer is located between HOMO energy level of the third light-emitting layer and HOMO energy level of the third hole transport layer, HOMO energy level difference between the third light-emitting layer and the third buffer layer is a sixth difference, and HOMO energy level difference between the third buffer layer and the third hole transport layer is a seventh difference, wherein one of the sixth difference and the seventh difference is greater than or equal to 0.3 eV.

In some embodiments, the first sub-pixel is a blue sub-pixel, and the second sub-pixel is one of a red sub-pixel and a green sub-pixel.

In some embodiments, the one of the third difference and the fourth difference is smaller than or equal to 0.7 eV; and the one of the sixth difference and the seventh difference is smaller than or equal to 0.7 eV.

Other features, aspects and advantages of the present disclosure will become apparent from the following detailed description of exemplary embodiments of the present disclosure with reference to the accompanying drawings.

BRIEF DESCRIPTION OF THE ACCOMPANYING DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1:
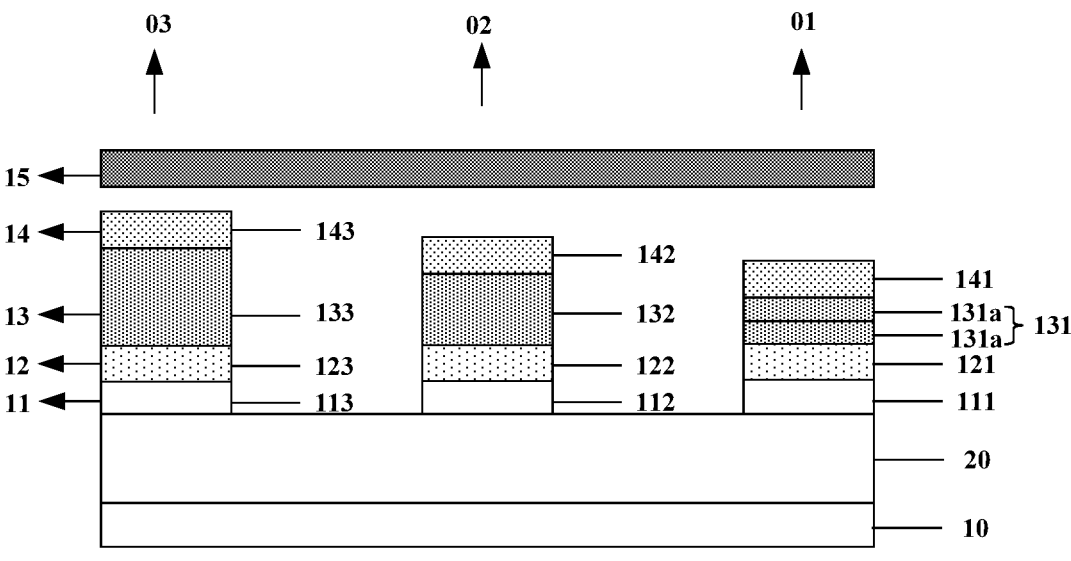
FIG. 1 is a schematic structural view showing a display panel according to an embodiment of the present disclosure.

It should be understood that the dimensions of various parts shown in the accompanying drawings are not necessarily drawn according to actual proportional relations. In addition, the same or similar components are denoted by the same or similar reference signs.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity, or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

In the related art, different types of sub-pixels in the display panel have different turn-on voltages (also referred to as a starting voltage). For example, the turn-on voltage of a blue sub-pixel, the turn-on voltage of a green sub-pixel and the turn-on voltage of a red sub-pixel gradually decrease.

The inventors have noticed that, in a case where the display panel displays a certain color in a low gray scale, some regions of the display panel will display other color(s) at the same time. For example, when the blue sub-pixel is on, the green sub-pixel and the red sub-pixel are also on. For another example, when the green sub-pixel is on, the red sub-pixel will also be on.

The inventors have found through studies that, when a turn-on voltage is applied to a type of sub-pixels with a high turn-on voltage, most of the current will flow to the light-emitting layer of this type of sub-pixels to drive this type of sub-pixels to emit light. However, some current will flow to the light-emitting layers in other types of sub-pixels with a low turn-on voltage to drive this type of sub-pixels to emit light at the same time, thereby causing a crosstalk phenomenon and affecting the display effect of the display panel.

To solve the above problem, the embodiments of the present disclosure provide the following technical solutions to improve the display effect of the display panel.

FIG. 1 is a schematic structural view showing a display panel according to an embodiment of the present disclosure.

As shown in FIG. 1, the display panel comprises a plurality of sub-pixels located on a base substrate 10. The plurality of sub-pixels comprises a first sub-pixel 01 and a second sub-pixel 02. It should be understood that the plurality of sub-pixels also comprises other sub-pixels, for example a third sub-pixel 03. It should also be understood that the plurality of sub-pixels can be defined by a pixel defining layer.

In addition, FIG. 1 also shows a driving circuit layer 20 located on the base substrate 10. For example, the driving circuit layer 20 may comprise a pixel driving circuit and a planarization layer covering the pixel driving circuit. Some implementations of the driving circuit layer 20 will be provided later in conjunction with FIG. 5.

The structure of each layer in the display panel will be introduced below.

As shown in FIG. 1, the display panel comprises an anode layer 11, a hole transport layer 12, a buffer layer 13, a light-emitting layer 14 and a cathode 15.

The anode layer 11 comprises a first anode 111 located in the first sub-pixel 01 and a second anode 112 located in the second sub-pixel 02. For example, the anode layer 11 may comprise a laminate, which may be indium tin oxide (ITO)/ silver (Ag)/ITO, for example. It should be understood that different anodes belonging to different sub-pixels in the anode layer 11 are spaced apart from each other.

The hole transport layer 12 is located on one side of the anode layer 11 away from the base substrate 10. The hole transport layer 12 comprises a first hole transport layer 121 located in the first sub-pixel 01 and a second hole transport layer 122 located in the second sub-pixel 02.

The buffer layer 13 is located on one side of the hole transport layer 12 away from the base substrate 10. Here, the buffer layer 13 comprises at least one of a first buffer layer 131 located in the first sub-pixel 01 or a second buffer layer 132 located in the second sub-pixel 02.

The light-emitting layer 14 is located on one side of the buffer layer 13 away from the base substrate 10. The light-emitting layer 14 comprises a first light-emitting layer 141 located in the first sub-pixel 01 and a second light-emitting layer 142 located in the second sub-pixel 02. Here, the HOMO (Highest Occupied Molecular Orbital) energy level difference between the first light-emitting layer 141 and the first hole transport layer 121 is a first difference greater than 0, and the absolute value of the HOMO energy level difference between the second light-emitting layer 142 and the second hole transport layer 122 is a second difference greater than 0 and smaller than the first difference. For example, the first difference is 0.51 eV and the second difference is 0.11 eV or 0.14 eV. For example, the HOMO energy level difference between the second light-emitting layer 142 and the second hole transport layer 122 is 0.11 eV or –0.14 eV. The light-emitting layer 14 may be, for example, an organic light-emitting layer.

The cathode 15 is located on one side of the light-emitting layer 14 away from the anode layer 111. For example, the cathode 15 is a planar cathode.

The first buffer layer 131 in the first sub-pixel 01 and the second buffer layer 132 in the second sub-pixel 02 will be described below.

The first buffer layer 131 comprises a plurality of first buffer sub-layers 131a. FIG. 1 schematically shows two first buffer sub-layers 131a. It should be understood that the first buffer layer 131 may comprise a greater number of first buffer sub-layers 131a.

The HOMO energy level of each first buffer sub-layer 131a is located between the HOMO energy level of the first light-emitting layer 141 and the HOMO energy level of the first hole transport layer 121. In other words, the HOMO energy level of each first buffer sub-layer 131a is smaller than the HOMO energy level of the first light-emitting layer 141 and greater than the HOMO energy level of the first hole transport layer 121. In addition, in a direction from the first hole transport layer 121 to the first light-emitting layer 141, the HOMO energy levels of the plurality of first buffer sub-layers 131a gradually increase.

Since the HOMO energy levels of the plurality of first buffer sub-layers 131a in the first sub-pixel 01 gradually increase, it is conductive for the hole to transition from the first hole transport layer 121 to the first light-emitting layer 141, thereby reducing the turn-on voltage of the first sub-pixel 01.

The HOMO energy level of the second buffer layer 132 is located between the HOMO energy level of the second light-emitting layer 142 and the HOMO energy level of the second hole transport layer 122. In other words, the HOMO energy level of the second buffer layer 132 is smaller than the HOMO energy level of the second light-emitting layer 142 and greater than the HOMO energy level of the second hole transport layer 122.

Here, the HOMO energy level difference between the second light-emitting layer 142 and the second buffer layer 132 is a third difference, and the HOMO energy level difference between the second buffer layer 132 and the second hole transport layer 122 is a fourth difference. One of the third difference and the fourth difference is greater than or equal to 0.3 eV. For example, the third difference is greater than or equal to 0.3 eV; for another example, the fourth difference is greater than or equal to 0.3 eV. It can be understood that in a case where one of the third difference and the fourth difference is greater than or equal to 0.3 eV, the other is smaller than 0 eV.

The energy level barrier between the second light-emitting layer 142 and the second hole transport layer 122 is set to be greater than or equal to 0.3 eV, so that it is more difficult for the hole to inject from the second hole transport layer 122 into the second light-emitting layer 142, thereby increasing the turn-on voltage of the second sub-pixel 02.

In some embodiments, the buffer layer 13 of the display panel comprises only the first buffer layer 131. In this way, the turn-on voltage of the first sub-pixel 01 is reduced, so that the turn-on voltage of the first sub-pixel 01 is closer to the turn-on voltage of the second sub-pixel 02.

In other embodiments, the buffer layer 13 of the display panel comprises only the second buffer layer 132. In this way, the turn-on voltage of the second sub-pixel 02 is increased, so that the turn-on voltage of the first sub-pixel 01 is also closer to the turn-on voltage of the second sub-pixel 02.

In still other embodiments, the buffer layer 13 of the display panel comprises the first buffer layer 131 and the second buffer layer. In this way, the turn-on voltage of the first sub-pixel 01 is reduced, and the turn-on voltage of the second sub-pixel 02 is increased, so that the turn-on voltage of the first sub-pixel 01 much closer to the turn-on voltage of the second sub-pixel 02.

In the above embodiments, the buffer layer 13 of the display panel comprises at least one of the first buffer layer 131 or the second buffer layer 132 located in the second sub-pixel 02, so as to realize at least one of reducing the turn-on voltage of the first sub-pixel 01 or increasing the turn-on voltage of the second sub-pixel 02, so that the turn-on voltage of the first sub-pixel 01 is closer to the turn-on voltage of the second sub-pixel 02. In this way, the possibility that the second sub-pixel 02 is on at the same time when the first sub-pixel 01 is on is reduced, thereby alleviating the crosstalk phenomenon of the display panel, and improving the display effect of the display panel.

For example, the first sub-pixel 01 is a blue sub-pixel, and the second sub-pixel 02 is one of a red sub-pixel and a green sub-pixel. In this way, the possibility that the red sub-pixel or the green sub-pixel is on at the same time when the blue sub-pixel is on is reduced, thereby alleviating the crosstalk phenomenon of the display panel, and improving the display effect of the display panel.

For another example, the first sub-pixel 01 is a green sub-pixel and the second sub-pixel 02 is a red sub-pixel. In this way, the possibility that the red sub-pixel is on at the same time when the green sub-pixel is on is reduced, thereby alleviating the crosstalk phenomenon of the display panel, and improving the display effect of the display panel.

In some embodiments, one of the third difference and the fourth difference is greater than or equal to 0.3 eV and smaller than or equal to 0.7 eV. For example, the third difference is greater than or equal to 0.3 eV and smaller than or equal to 0.7 eV, for example, is 0.4 eV, 0.5 eV or 0.6 eV. For another example, the fourth difference is greater than or equal to 0.3 eV and smaller than or equal to 0.7 eV, for example, is 0.4 eV, 0.5 eV or 0.6 eV. When the third difference or the fourth difference is within the above range, the turn-on voltage of the second sub-pixel 02 can be effectively increased while the working voltage of the second sub-pixel 02 is not too high, thereby balancing the turn-on voltage and the working voltage of the second sub-pixel 02.

In some embodiments, the first hole transport layer 121 and the second hole transport layer 122 are continuous. For example, the hole transport layer 12 is integrated, and different sub-pixels share the hole transport layer 12. The inventors have noticed that the crosstalk phenomenon of the display panel is particularly apparent in the case where the first hole transport layer 121 and the second hole transport layer 122 are continuous. Therefore, the crosstalk phenomenon of the display panel can be alleviated more apparently to improve the display effect of the display panel by using the solutions of the embodiments of the present disclosure.

In some embodiments, referring to FIG. 1, the plurality of sub-pixels further comprises a third sub-pixel 03. Correspondingly, each of the anode layer 11, the hole transport layer 12, the buffer layer 13 and the light-emitting layer 14 comprises a portion located in the third sub-pixel 03. A detailed description will be made below in conjunction with FIG. 1.

The anode layer 11 further comprises a third anode 113 located in the third sub-pixel 03. It should be understood that the third anode 113 is spaced apart from the first anode 111 and the second anode 112.

The hole transport layer 12 further comprises a third hole transport layer 123 located in the third sub-pixel 03. In some embodiments, the third hole transport layer 123, the first hole transport layer 121 and the second hole transport layer 122 are continuous.

The buffer layer 13 further comprises a third buffer layer 133 located in the third sub-pixel 03.

The light-emitting layer 14 further comprises a third light-emitting layer 143 located in the third sub-pixel 03.

The HOMO energy level difference between the third light-emitting layer 143 and the third hole transport layer 123 is a fifth difference greater than 0 and smaller than the first difference.

The HOMO energy level of the third buffer layer 133 is located between the HOMO energy level of the third light-emitting layer 143 and the HOMO energy level of the third hole transport layer 123. The HOMO energy level difference between the third light-emitting layer 143 and the third buffer layer 133 is a sixth difference, and the HOMO energy level difference between the third buffer layer 133 and the third hole transport layer 123 is a seventh difference. Here, one of the sixth difference and the seventh difference is greater than or equal to 0.3 eV.

For example, the sixth difference is greater than or equal to 0.3 eV; for another example, the seventh difference is greater than or equal to 0.3 eV. It can be understood that in a case where one of the sixth difference and the seventh difference is greater than or equal to 0.3 eV, the other is smaller than 0 eV.

The energy level barrier between the third light-emitting layer 143 and the third hole transport layer 123 is set to be greater than or equal to 0.3 eV, so that it is more difficult for the hole to inject from the third hole transport layer 123 into the third light-emitting layer 143, thereby increasing the turn-on voltage of the third sub-pixel 03.

In the above embodiments, the buffer layer 13 of the display panel further comprises a third buffer layer 133, so as to not only realize at least one of reducing the turn-on voltage of the first sub-pixel 01 or increasing the turn-on voltage of the second sub-pixel 02, but also realize the increase of the turn-on voltage of the third sub-pixel 03, so that the turn-on voltage of the first sub-pixel 01, the turn-on voltage of the second sub-pixel 02 and the turn-on voltage of the third sub-pixel 03 are closer to each other. In this way, the possibility that the second sub-pixel 02 and the third sub-pixel 03 are on at the same time when the first sub-pixel 01 is on is reduced, thereby further alleviating the crosstalk phenomenon of the display panel, and further improving the display effect of the display panel.

As some implementations, the first sub-pixel 01 is a blue sub-pixel, the second sub-pixel 02 is one of a red sub-pixel and a green sub-pixel, and the third sub-pixel 03 is the other of a red sub-pixel and a green sub-pixel. For example, the second sub-pixel 02 is a red sub-pixel and the third sub-pixel 03 is a green sub-pixel; and vice versa. In this way, the possibility that the red sub-pixel and the green sub-pixel are on at the same time when the blue sub-pixel is on is reduced.

In some embodiments, one of the sixth difference and the seventh difference is greater than or equal to 0.3 eV and smaller than or equal to 0.7 eV. For example, the sixth difference is greater than or equal to 0.3 eV and smaller than or equal to 0.7 eV, for example, is 0.4 eV, 0.5 eV or 0.6 eV. For another example, the seventh difference is greater than or equal to 0.3 eV and smaller than or equal to 0.7 eV, for example, is 0.4 eV, 0.5 eV or 0.6 eV. When the sixth difference or the seventh difference is within the above range, the turn-on voltage of the third sub-pixel 03 can be effectively increased while the working voltage of the third sub-pixel 03 is not too high, thereby balancing the turn-on voltage and the working voltage of the third sub-pixel 03 at the same time.

Figure 2:
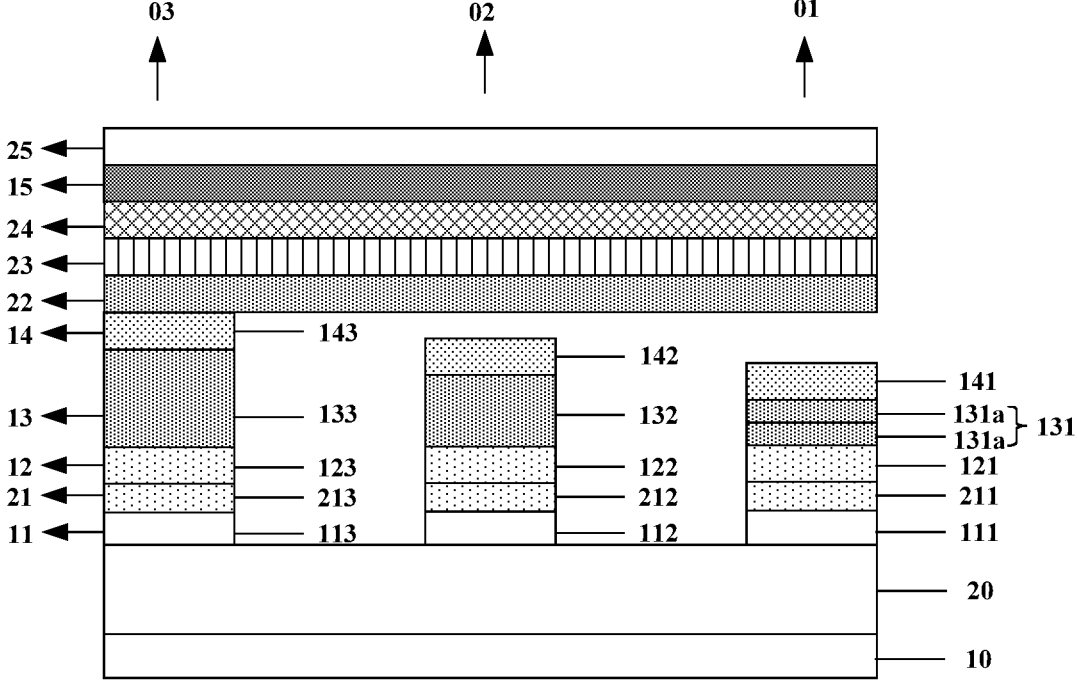
FIG. 2 is a schematic structural view showing a display panel according to another embodiment of the present disclosure.

FIG. 2 is a schematic structural view showing a display panel according to another embodiment of the present disclosure.

The differences from the embodiment shown in FIG. 1 will be mainly introduced below only, and for other similarities, reference can be made to the above relevant description of FIG. 1.

As shown in FIG. 2, in some embodiments, the display panel further comprises one or more layers of a hole injection layer 21, a hole blocking layer 22, an electron transport layer 23 and an electron injection layer 24. It should be understood that each of the hole injection layer 21, the hole blocking layer 22, the electron transport layer 23 and the electron injection layer 24 comprises portions located in different sub-pixels.

The hole injection layer 21 is located between the anode layer 11 and the hole transport layer 12. For example, the hole injection layer 21 comprises a first hole injection layer 211 located in the first sub-pixel 01 and a second hole injection layer 212 located in the second sub-pixel 02. In some embodiments, the hole injection layer 21 further comprises a third hole injection layer 213 located in the third sub-pixel 01. In some embodiments, the first hole injection layer 211 and the second hole injection layer 212 are continuous. In some embodiments, the first hole injection layer 211, the second hole injection layer 212 and the third hole injection layer 213 are continuous. For example, the hole injection layer 21 is integrated.

The hole blocking layer 22 is located on one side of the light-emitting layer 14 away from the base substrate 10, the electron transport layer 23 is located on one side of the hole blocking layer 22 away from the base substrate 10, and the electron injection layer 24 is located between the electron transport layer 23 and the cathode 15.

For example, the hole blocking layer 22, the electron transport layer 23 and the electron injection layer 24 in the display panel are all shared by a plurality of sub-pixels in the display panel.

In some embodiments, the display panel further comprises a cover layer 25 located on one side of the cathode 15 away from the base substrate 10. In some embodiments, the display panel further comprises an encapsulation layer (not shown in FIG. 2) located on one side of the cover layer 25 away from the base substrate 10. The encapsulation layer may comprise, for example, a first inorganic layer, a second inorganic layer, and an organic layer located between the first inorganic layer and the second inorganic layer. In other embodiments, the encapsulation layer may also comprise more layers, for example, another organic layer located on one side of the second inorganic layer away from the base substrate 10, and a third inorganic layer located on one side of the another organic layer away from the base substrate 10.

Figure 3A:
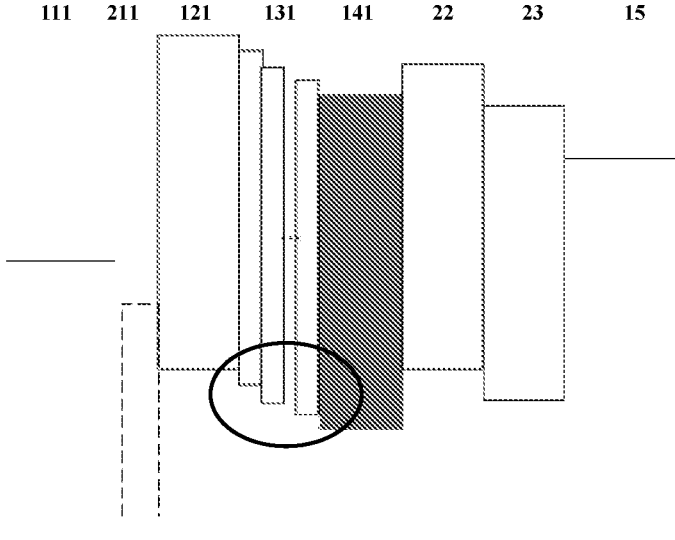
FIGS. 3A-3C are schematic views showing HOMO energy levels of some layers of a display panel according to some embodiments of the present disclosure.
Figure 3B:
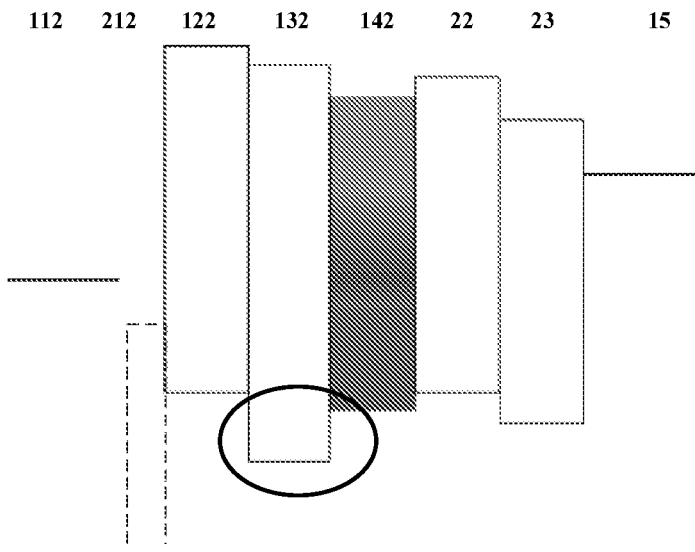
Figure 3C:
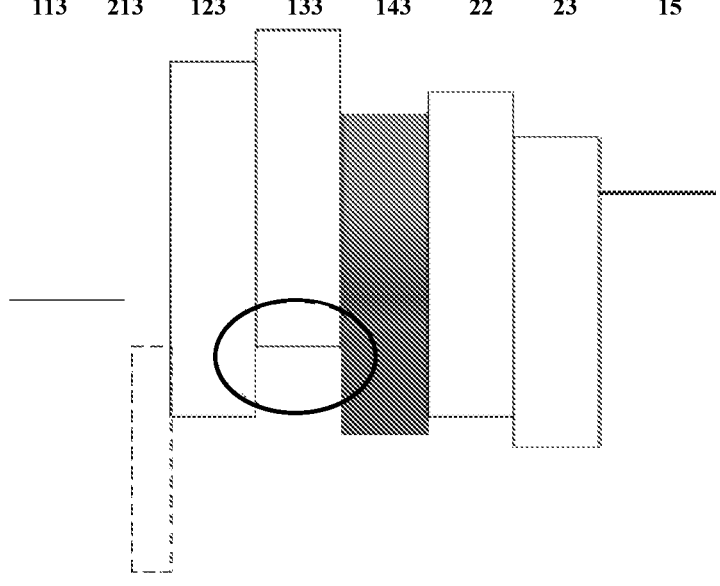

FIGS. 3A-3C are schematic views showing HOMO energy levels of some layers of a display panel according to some embodiments of the present disclosure.

As shown by the circle in FIG. 3A, the HOMO energy levels of the plurality of first buffer sub-layers 131a in the first buffer layer 131 gradually increase, which reduces the difficulty for the hole to inject from the first hole transport layer 121 into the first light-emitting layer 141.

As shown by the circle in FIG. 3B, the HOMO energy level difference between the second light-emitting layer 142 and the second hole transport layer 122 is greater than or equal to 3 eV. In this case, the second buffer layer 132 with a deeper HOMO energy level is inserted between the second light-emitting layer 142 and the second hole transport layer 122, which increases the difficulty for the hole to inject from the second hole transport layer 122 into the second light-emitting layer 142.

As shown in FIG. 3C, the HOMO energy level difference between the third light-emitting layer 143 and the third buffer layer 133 is greater than or equal to 3 eV. In this case, the third buffer layer 133 with a shallower HOMO energy level is inserted between the third light-emitting layer 143 and the third hole transport layer 123, which increases the difficulty for the hole to inject from the third hole transport layer 123 into the third light-emitting layer 143.

Taking the first sub-pixel 01 as a blue sub-pixel and the second sub-pixel 02 as one of a red sub-pixel and a green sub-pixel as an example, some implementations of the first buffer layer 131 will be described below.

In the first buffer layer 131, the thickness of at least one of the plurality of first buffer sub-layers 131 ranges from 2 nm to 10 nm, for example, is 5 nm, 7 nm, or 9 nm, etc. For example, each first buffer sub-layer 131a has a thickness ranging from 2 nm to 10 nm.

In some embodiments, the first mobility of at least one of the plurality of first buffer sub-layers 131a is greater than or equal to $10^{-6}$ cm$^2$/V·s. For example, the first mobility of each first buffer sub-layer 131a is greater than or equal to $10^{-6}$ cm$^2$/V·s. Such a first buffer sub-layer 131a is more conducive to improving the light efficiency of the display panel.

In some embodiments, the first mobility is greater than or equal to $10^{-6}$ cm$^2$/V·s and smaller than or equal to $10^{-2}$ cm$^2$/V·s. For example, the first mobility is $10^{-4}$ cm$^2$/V·s, or $10^{-3}$ cm$^2$/V·s, etc.

Taking the first sub-pixel 01 as a blue sub-pixel and the second sub-pixel 02 as one of a red sub-pixel and a green sub-pixel, some implementations of the second buffer layer 132 and the third buffer layer 133 will be described below.

As some implementations, the thickness of at least one of the second buffer layer 132 or the third buffer layer 133 ranges from 30 nm to 100 nm, for example, is 40 nm, 60 nm, or 80 nm, etc.

As some implementations, the second mobility of at least one of the second buffer layer 132 or the third buffer layer 133 is greater than or equal to $10^{-4}$ cm$^2$/V·s. Such a second buffer layer 132 is conductive to realize rapid migration of a hole to the second light-emitting layer 142, thereby realizing rapid and efficient recombination of a hole and an electron. This is conductive to improving the light-emitting efficiency of the display panel.

In addition, in a case where the second mobility is greater than or equal to $10^{-4}$ cm$^2$/V·s, it is conductive to allow that the working voltages of the second sub-pixel 02 and the third sub-pixel 03 do not increase or only increase in a small amplitude in the case where the turn-on voltages of the second sub-pixel 02 and the third sub-pixel 03 are increased.

In some embodiments, the second mobility is greater than or equal to $10^{-4}$ cm$^2$/V·s and smaller than or equal to $10^{-2}$ cm$^2$/V·s. For example, the second mobility is $10^{-3}$ cm$^2$/V·s, etc.

In some embodiments, each sub-pixel in the display panel comprises a micro-cavity structure. It should be understood that by adjusting the thickness (also referred to as an optical length) of the micro-cavity structure in each sub-pixel, the light interference of a specific wavelength can be enhanced, so that each sub-pixel emits high-brightness light, for example, a red sub-pixel R can emit high-brightness red light, a green sub-pixel G can emit high-brightness green light, and a blue sub-pixel B can emit high-brightness blue light.

In some embodiments, the first buffer layer 131, the second buffer layer 132 and the third buffer layer 133 have thicknesses different from each other, so that the micro-cavity structures in the first sub-pixel 01, the second sub-pixel 02 and the third sub-pixel 03 have thicknesses different from each other. For example, layers other than the respective buffer layers in the micro-cavity structures of different sub-pixels may have a same thickness. In other words, the buffer layers in the micro-cavity structures of different sub-pixels have different thicknesses, which makes the micro-cavity structures of different sub-pixels have different thicknesses.

Some implementations of the materials of the first buffer layer 131, the second buffer layer 132 and the third buffer layer 133 will be introduced below.

In some embodiments, in the first buffer layer 131, the branched chain of each of the plurality of first buffer sub-layers 131a contains a first electron donating group, and the branched chain of each of the second buffer layer 132 and the third buffer layer 133 contains one of a second electron donating group and an electron withdrawing group. Here, the electron donating ability of the second electron donating group is greater than the electron donating ability of the first electron donating group.

According to some implementations, the branched chain of the first buffer sub-layer 131a contains a weak electron donating group, for example, H, a substituted or un-substituted alkyl group with 1 to 10 carbon atoms, a substituted or un-substituted naphthene base group with 3 to 15 carbon atoms, or a substituted or un-substituted aryl group with 6 to 18 carbon atoms. The functional group containing only C and H elements have a weaker electron donating ability than the functional group containing other elements (for example, N, O, S, halogen, etc.), thereby ensuring that the HOMO energy level of the first buffer sub-layer 131a is located between that of the first hole transport layer 121 and that of the first light-emitting layer 141, for example, between about 5.37 eV and about 5.88 eV.

According to other implementations, the branched chains of the second buffer layer 132 and the third buffer layer 133 contain a strong electron donating group, for example, a substituted or un-substituted alkyl group with 5 to 30 carbon atoms, a substituted or un-substituted naphthene base group with 3 to 30 carbon atoms, a substituted or un-substituted aryl group with 6 to 36 carbon atoms, or a structure containing a long conjugated chain (for example, the number of conjugated units is greater than or equal to 3). A strong electron donating group and a long conjugated chain are conductive to deepening the energy of HOMO so that the HOMO energy level become larger, as shown in FIG. 3B.

According to still other implementations, the branched chains of the second buffer layer 132 and the third buffer layer 133 contain a weak electron-withdrawing group, for example, a functional group containing halogen, N, O, S, P, or other elements. The electron-withdraw group is conductive to reducing the energy of HOMO so that the HOMO energy level become smaller, as shown in FIG. 3C.

Figure 4:
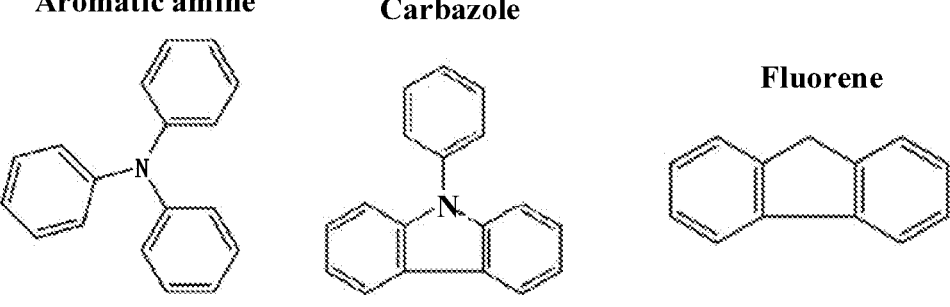
FIG. 4 is a schematic view showing bodies of a first buffer sub-layer, a second buffer layer and a third buffer layer according to some embodiments of the present disclosure.

FIG. 4 is a schematic view showing hosts of a first buffer sub-layer, a second buffer layer and a third buffer layer according to some embodiments of the present disclosure.

As some implementations, as shown in FIG. 4, the hosts of the first buffer sub-layer 131a, the second buffer layer 132 and the third buffer layer 133 are compounds containing large n conjugated orbital or p-π conjugated orbital, for example, are fluorene compounds or carbazole compounds.

As other implementations, as shown in FIG. 4, the hosts of the first buffer sub-layer 131a, the second buffer layer 132 and the third buffer layer 133 are compounds containing atom that can provide p electrons, for example, are aromatic amines compounds.

Figure 5:
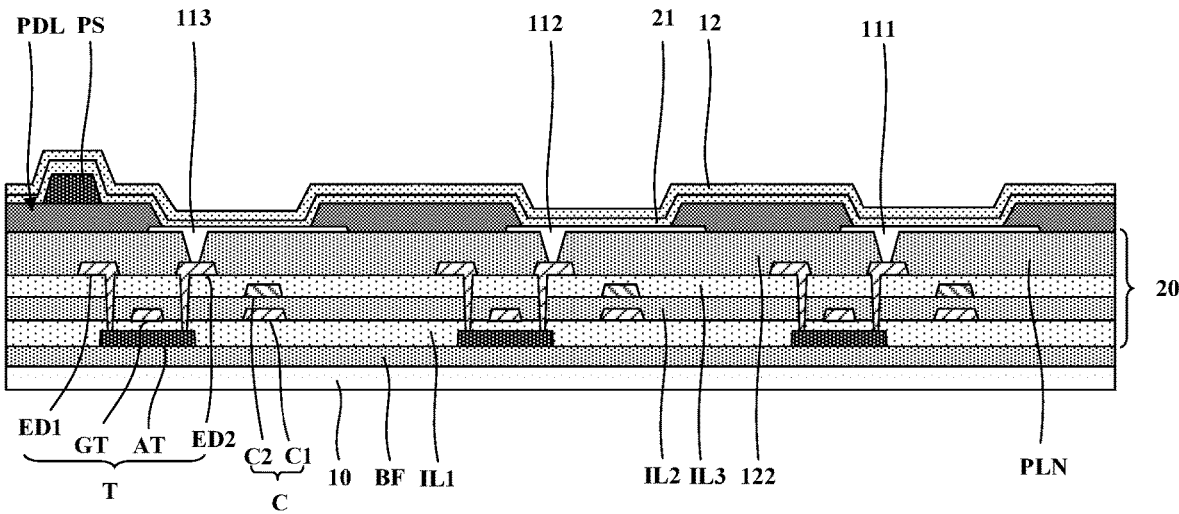
FIG. 5 is a schematic structural view showing a display panel according to a further embodiment of the present disclosure.

FIG. 5 is a schematic structural view showing a display panel according to a further embodiment of the present disclosure. It is to be noted that FIG. 5 mainly shows the structure of the driving circuit layer 20, while the structures of other layers are omitted.

As shown in FIG. 5, the pixel driving circuit in the driving circuit layer 20 may comprise a thin film transistor T and a capacitor C. It should be understood that the pixel driving circuit may also comprise other thin film transistors. For example, the pixel driving circuit may comprise six thin film transistors and one capacitor C (6t1c). For another example, the pixel driving circuit may comprise seven thin film transistors and one capacitor C (7T1C).

The thin film transistor T comprises an active layer AT located on one side of the base substrate 10, a first insulating layer IL1 located on one side of the active layer AT away from the base substrate 10, a gate GT located on one side of the first insulating layer IL1 away from the base substrate 10, and a first electrode ED1 and a second electrode ED2 penetrating through the second insulating layer IL2 and the third insulating layer IL3. Here, the second insulating layer IL2 is located on one side of the gate GT away from the base substrate 10, and the third insulating layer IL3 is located on one side of the second insulating layer IL2 away from the base substrate 10. For example, the material of the active layer at may comprise one or more of amorphous indium gallium zinc oxide (a-IGZO), zinc oxynitride (ZnON), indium zinc tin oxide (IZTO), amorphous silicon (a-Si), polysilicon (p-Si), hexathiophene and polythiophene. For example, the materials of the first insulating layer IL1, the second insulating layer IL2, and the third insulating layer IL3 may comprise one or more of oxide of silicon, nitride of silicon and oxynitride of silicon. As some implementations, the material of at least one of the first electrode ED1 or the second electrode ED1 may comprise metal or alloy. Examples of metal may comprise one or more of silver (Ag), copper (Cu), aluminum (Al), titanium (Ti) and molybdenum (Mo). Examples of alloy may comprise aluminum-neodymium alloy (AlNd) or molybdenum-niobium alloy (MoNb). For example, the first electrode ED1 and the second electrode ED1 may have a single-layer structure or a multi-layer structure, for example, Ti/Al/Ti or the like.

The capacitor C comprises a first electrode plate C1 located between the first insulating layer IL1 and the second insulating layer IL2, and a second electrode plate C2 located between the second insulating layer IL2 and the third insulating layer IL3. It should be understood that the capacitor C further comprises the second insulating layer IL2 located between the first electrode plate C1 and the second electrode plate C2. The planarization layer PLN covers the first electrode ED1 and the second electrode ED2. For example, the first electrode plate C1 and the gate GT may be located in a same layer, that is, formed by patterning a same material layer. As some implementations, the material of at least one of the first electrode plate C1 or the second electrode plate C2 may comprise the above metal or the above alloy.

The first anode 111, the second anode 112, and the third anode 113 are located on one side of the planarization layer PLN away from the base substrate 10 and connected to the second electrode ED2 of the thin film transistor T in a corresponding pixel driving circuit through a via hole penetrating through the planarization layer PLN respectively.

FIG. 5 also shows a pixel defining layer PDL and a post spacer PS located on one side of the pixel defining layer PDL away from the base substrate 10. The spacer post PS is configured to support a mask, for example, a fine metal mask (FMM).

In some embodiments, referring to FIG. 5, the display panel may further comprise a buffer layer BF located between the base substrate 10 and the active layer AT. The buffer layer BF is used for improving the water and oxygen resistance of the base substrate 10. For example, the buffer layer BF can block water vapor and oxygen from entering the active layer AT.

Figure 6:
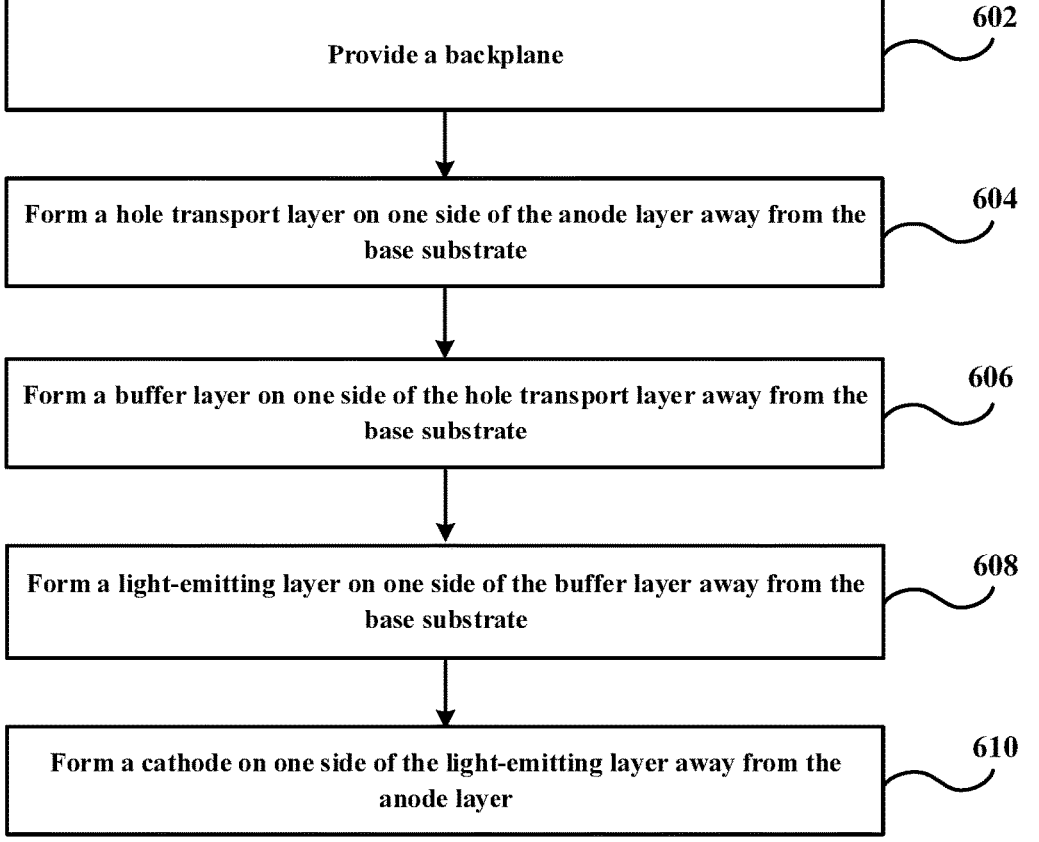
FIG. 6 is a flowchart showing a manufacturing method of a display panel according to an embodiment of the present disclosure.

FIG. 6 is a flowchart showing a manufacturing method of a display panel according to an embodiment of the present disclosure.

Here, the display panel comprises a plurality of sub-pixels located on a base substrate, and the plurality of sub-pixels comprises a first sub-pixel and a second sub-pixel. In some embodiments, the plurality of sub-pixels further comprises a third sub-pixel.

First, at step 602, a backplane is provided.

Here, the backplane comprises an anode layer located on the base substrate. The anode layer comprises a first anode located in the first sub-pixel and a second anode located in the second sub-pixel. In some embodiments, the anode layer further comprises a third anode located in the third sub-pixel.

The backplane may comprise, for example, layers except the hole transport layer 12 and the hole injection layer 21 in the display panel shown in FIG. 5.

Then, at step 604, a hole transport layer is formed on one side of the anode layer away from the base substrate.

Here, the hole transport layer comprises a first hole transport layer located in the first sub-pixel and a second hole transport layer located in the second sub-pixel. In some embodiments, the hole transport layer further comprises a third hole transport layer located in the third sub-pixel.

For example, the first hole transport layer may be formed by an evaporation process using an open mask. As some implementations, the opening mask may comprise a metal mask.

In some embodiments, a hole injection layer may be first formed, and a hole transport layer may be then formed on one side of the hole injection layer away from the base substrate. For example, a hole injection layer may be formed by an evaporation process using an open mask.

Next, at step 606, a buffer layer is formed on one side of the hole transport layer away from the base substrate.

Here, the buffer layer comprises at least one of a first buffer layer located in the first sub-pixel or a second buffer layer located in the second sub-pixel. In some embodiments, the buffer layer further comprises a third buffer layer located in the third sub-pixel.

For example, the first buffer layer, the second buffer layer and the third buffer layer may be formed by FMM respectively.

Next, at step 608, a light-emitting layer is formed on one side of the buffer layer away from the base substrate.

Here, the light-emitting layer comprises a first light-emitting layer located in the first sub-pixel and a second light-emitting layer located in the second sub-pixel.

For example, the first light-emitting layer and the second light-emitting layer may be formed by FMM respectively.

The HOMO energy level difference between the first light-emitting layer and the first hole transport layer is a first difference greater than 0, and the absolute value of the HOMO energy level difference between the second light-emitting layer and the second hole transport layer is a second difference. The second difference is greater than 0 and smaller than the first difference.

The first buffer layer comprises a plurality of first buffer sub-layers. The HOMO energy level of each first buffer sub-layer is located between the HOMO energy level of the first light-emitting layer and the HOMO energy level of the first hole transport layer. In addition, in a direction from the first hole transport layer to the first light-emitting layer, the HOMO energy levels of the plurality of first buffer sub-layers gradually increase.

The HOMO energy level of the second buffer layer is located between the HOMO energy level of the second light-emitting layer and the HOMO energy level of the second hole transport layer. The HOMO energy level difference between the second light-emitting layer and the second buffer layer is a third difference, and the HOMO energy level difference between the second buffer layer and cover layer away from the base substrate, and an encapsulation layer may be then formed on one side of the LiF layer away from the base substrate.

It is to be noted that for specific implementations of each layer in the above display panel, reference may be made to the above description, and description will not be made in detail.

In the above embodiments, the formed buffer layer of the display panel comprises at least one of the first buffer layer or the second buffer layer located in the second sub-pixel, so as to realize at least one of reducing the turn-on voltage of the first sub-pixel or increasing the turn-on voltage of the second sub-pixel, so that the turn-on voltage of the first sub-pixel is closer to the turn-on voltage of the second sub-pixel. In this way, the possibility that the second sub-pixel is on at the same time when the first sub-pixel is on is reduced, thereby alleviating the crosstalk phenomenon of the display panel, and improving the display effect of the display panel.

Table 1 shows the parameters of different sub-pixels of a comparative example (referred to as Example 1 below) and an example of the embodiments of the present disclosure (referred to as Example 2 below).

TABLE 1

| | Example 1 | | | | Example 2 | | | |
| Sub-pixel | Turn-on voltage | Working voltage | Efficiency | Lifetime | Turn-on voltage | Working voltage | Efficiency | Lifetime |
| --- | --- | --- | --- | --- | --- | --- | --- | --- |
| B | 2.9 V | 100% | 100% | 100% | 2.6 V | 98% | 103% | 101% |
| G | 2.2 V | 100% | 100% | 100% | 2.6 V | 102% | 105% | 97% |
| R | 2.1 V | 100% | 100% | 100% | 2.5 V | 103% | 104% | 96% | the second hole transport layer is a fourth difference. One of the third difference and the fourth difference is greater than or equal to 0.3 eV.

In some embodiments, the light-emitting layer further comprises a third light-emitting layer located in the third sub-pixel. The HOMO energy level difference between the third light-emitting layer and the third hole transport layer is a fifth difference greater than 0 and smaller than the first difference. The HOMO energy level of the third buffer layer is located between the HOMO energy level of the third light-emitting layer and the HOMO energy level of the third hole transport layer. The HOMO energy level difference between the third light-emitting layer and the third buffer layer is a sixth difference, and the HOMO energy level difference between the third buffer layer and the third hole transport layer is a seventh difference. One of the sixth difference and the seventh difference is greater than or equal to 0.3 eV.

Then, at step 610, a cathode is formed on one side of the light-emitting layer away from the anode layer.

For example, the material of the cathode may comprise a semi-transparent and semi-reflective material, for example, magnesium-silver alloy (MgAg), indium-zinc oxide (IZO) or the like.

In some embodiments, before the cathode is formed, a hole blocking layer, an electron transport layer and an electron injection layer may be first sequentially formed by using an open mask.

In some embodiments, after the cathode is formed, a cover layer and an encapsulation layer may also be sequentially formed on one side of the cathode away from the base substrate. In some embodiments, after the cover plate is formed, a LiF layer may also be formed on one side of the In Example 1, the first buffer layer 131 in the blue sub-pixel B, the second buffer layer 132 in the green sub-pixel G and the third buffer layer 133 in the red sub-pixel R each has a single-layer structure, and the HOMO energy levels of the first buffer layer 131, the second buffer layer 132 and the third buffer layer 133 are 5.61 eV, 5.55 eV and 5.49 eV respectively. The parameters of other layers are the same as in Example 2.

In Example 2, the first sub-pixel 01 is a blue sub-pixel B, the second sub-pixel 02 is a green sub-pixel G, and the third sub-pixel 03 is a red sub-pixel R.

In the blue sub-pixel B, the HOMO energy level of the first hole transport layer 121 is 5.37 eV, and the HOMO energy level of the first light-emitting layer 141 is 5.88 eV. The first buffer layer 131 comprises two first buffer sub-layers 131a. The HOMO energy level of one of the two first buffer sub-layers 131a closer to the base substrate 10 is 5.55 eV, and the HOMO energy level of the other of the two first buffer sub-layers 131a is 5.72 eV.

In the green sub-pixel G, the HOMO energy level of the second hole transport layer 122 is 5.37 eV, the HOMO energy level of the second light-emitting layer 142 is 5.48 eV, and the HOMO energy level of the second buffer layer 132 is 5.69 eV.

In the red sub-pixel R, the HOMO energy level of the third hole transport layer 123 is 5.37 eV, the HOMO energy level of the third light-emitting layer 143 is 5.23 eV, and the HOMO energy level of the third buffer layer 133 is 5.54 eV.

Figure 7A:
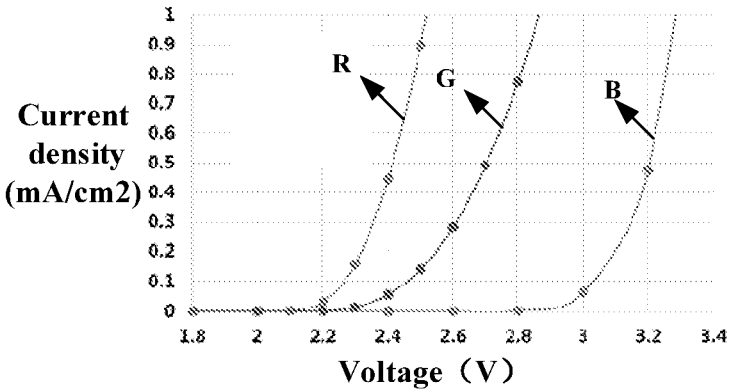
FIG. 7A is a schematic view of a curve showing the change of a current density in the function of a voltage in Example 1.
Figure 7B:
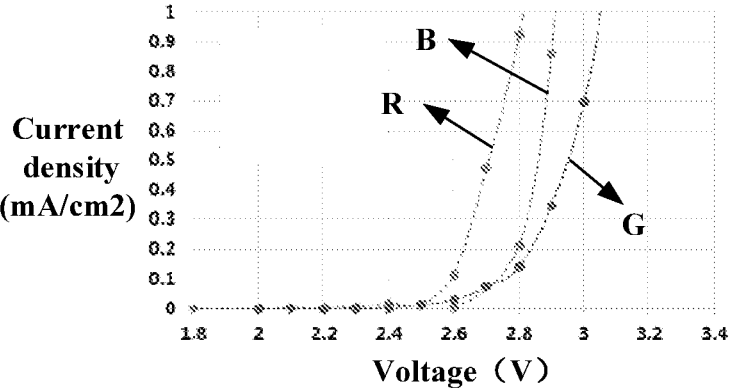
FIG. 7B is a schematic view a curve showing the change of a current density in the function of a voltage in Example 2.

FIG. 7A is a schematic view showing a curve of a current density in the function of a voltage in Example 1. FIG. 7B is a schematic view showing a curve of a current density in the function of a voltage in Example 2.

As can be also seen from the J (current density) –V (voltage) curves of different sub-pixels shown in FIGS. 7A and 7B that in Example 1, the difference between the turn-on voltages of the blue sub-pixel B, the green sub-pixel G and the red sub-pixel R is large; while in Example 2, the difference between the turn-on voltages of the blue sub-pixel B, the green sub-pixel G and the red sub-pixel R is small.

As can be seen from FIG. 7A and Table 1, in Example 1, the turn-on voltages of the blue sub-pixel B, the green sub-pixel G and the red sub-pixel R are 2.9V, 2.2V and 2.1V respectively. The turn-on voltage of the blue sub-pixel B is much greater than the turn-on voltages of the green sub-pixel G and the red sub-pixel R. When the blue sub-pixel B is on alone, the green sub-pixel G and the red sub-pixel R will emit light at the same time, thereby causing crosstalk and affecting the low-gray display quality of the display panel.

As can be seen from FIG. 7B and Table 1, in Example 2, the turn-on voltages of the blue sub-pixel B, the green sub-pixel G and the red sub-pixel R are 2.6V, 2.6V and 2.5V respectively. The turn-on voltages of the three pixels are prone to be balanced. In this way, when a type of sub-pixels in the display panel display in a low gray scale, it is less likely to be accompanied by a light-emitting phenomenon, thereby greatly improving the display quality in a low gray scale.

In addition, Example 2 ensures other performances of the sub-pixels whilst balancing the turn-on voltages of different sub-pixels. For example, the light efficiency of the sub-pixels is slightly improved.

The embodiments of the present disclosure also provide a display apparatus, which may comprise the display panel according to any one of the above embodiments. In an embodiment, the display apparatus may be any product or member having a display function, such as a display panel, a mobile terminal, a television, a display, a notebook computer, a digital photo frame, a navigator, or an electronic paper.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A display panel, comprising a plurality of sub-pixels located on a base substrate, the plurality of sub-pixels comprising a first sub-pixel and a second sub-pixel, the display panel comprising:

an anode layer comprising a first anode located in the first sub-pixel and a second anode located in the second sub-pixel;

a hole transport layer located on one side of the anode layer away from the base substrate, and comprising a first hole transport layer located in the first sub-pixel and a second hole transport layer located in the second sub-pixel;

a buffer layer located on one side of the hole transport layer away from the base substrate, and comprising at least one of a first buffer layer located in the first sub-pixel or a second buffer layer located in the second sub-pixel;

a light-emitting layer located on one side of the buffer layer away from the base substrate, and comprising a first light-emitting layer located in the first sub-pixel and a second light-emitting layer located in the second sub-pixel, wherein Highest Occupied Molecular Orbital (HOMO) energy level difference between the first light-emitting layer and the first hole transport layer is a first difference greater than 0, and an absolute value of HOMO energy level difference between the second light-emitting layer and the second hole transport layer is a second difference greater than 0 and smaller than the first difference; and a cathode located on one side of the light-emitting layer away from the anode layer, wherein:

the first buffer layer comprises a plurality of first buffer sub-layers, and HOMO energy level of each of the plurality of first buffer sub-layers is located between HOMO energy level of the first light-emitting layer and HOMO energy level of the first hole transport layer, and HOMO energy levels of the plurality of first buffer sub-layers gradually increase in a direction from the first hole transport layer to the first light-emitting layer, HOMO energy level of the second buffer layer is located between HOMO energy level of the second light-emitting layer and HOMO energy level of the second hole transport layer, and HOMO energy level difference between the second light-emitting layer and the second buffer layer is a third difference, and HOMO energy level difference between the second buffer layer and the second hole transport layer is a fourth difference, wherein one of the third difference and the fourth difference is greater than or equal to 0.3 eV, and a branched chain of each of the plurality of first buffer sub-layers contains a first electron donating group, and a branched chain of each of the second buffer layer contains one of a second electron donating group and an electron withdrawing group, wherein an electron donating ability of the second electron donating group is greater than an electron donating ability of the first electron donating group.

2. The display panel according to claim 1, wherein the plurality of sub-pixels further comprises a third sub-pixel, wherein:

the anode layer further comprises a third anode located in the third sub-pixel;

the hole transport layer further comprises a third hole transport layer located in the third sub-pixel;

the buffer layer further comprises a third buffer layer located in the third sub-pixel; and the light-emitting layer further comprises a third light-emitting layer located in the third sub-pixel, and HOMO energy level difference between the third light-emitting layer and the third hole transport layer is a fifth difference greater than 0 and smaller than the first difference, wherein HOMO energy level of the third buffer layer is located between HOMO energy level of the third light-emitting layer and HOMO energy level of the third hole transport layer, HOMO energy level difference between the third light-emitting layer and the third buffer layer is a sixth difference, and HOMO energy level difference between the third buffer layer and the third hole transport layer is a seventh difference, wherein one of the sixth difference and the seventh difference is greater than or equal to 0.3 eV.

3. The display panel according to claim 1, wherein the first sub-pixel is a blue sub-pixel, and the second sub-pixel is one of a red sub-pixel and a green sub-pixel.

4. The display panel according to claim 3, wherein at least one of the plurality of first buffer sub-layers has a thickness ranging from 2 nm to 10 nm.

5. The display panel according to claim 3, wherein a first mobility of at least one of the plurality of first buffer sub-layers is greater than or equal to 10-6 cm2/V·s.

6. The display panel according to claim 5, wherein the first mobility is smaller than or equal to 10-2 cm2/V·s.

7. The display panel according to claim 2, wherein at least one of the second buffer layer or the third buffer layer has a thickness ranging from 30 nm to 100 nm.

8. The display panel according to claim 2, wherein a second mobility of at least one of the second buffer layer or the third buffer layer is greater than or equal to $10^{-4}$ cm2/V·s.

9. The display panel according to claim 8, wherein the second mobility is smaller than or equal to $10^{-2}$ cm2/V·s.

10. The display panel according to claim 2, wherein a branched chain of the third buffer layer contains one of the second electron donating group and the electron withdrawing group.

11. The display panel according to claim 1, wherein the one of the third difference and the fourth difference is smaller than or equal to 0.7 eV.

12. The display panel according to claim 2, wherein the one of the sixth difference and the seventh difference is smaller than or equal to 0.7 eV.

13. The display panel according to claim 1, wherein the first hole transport layer and the second hole transport layer are continuous.

14. The display panel according to claim 1, further comprising:

a hole injection layer comprising a first hole injection layer located in the first sub-pixel and a second hole injection layer located in the second sub-pixel.

15. The display panel according to claim 14, wherein the first hole injection layer and the second hole injection layer are continuous.

16. A display apparatus, comprising the display panel according to claim 1.

17. A manufacturing method of a display panel, the display panel comprising a plurality of sub-pixels located on a base substrate, the plurality of sub-pixels comprising a first sub-pixel and a second sub-pixel, the manufacturing method comprising:

providing a backplane, the backplane comprising an anode layer located on the base substrate, the anode layer comprising a first anode located in the first sub-pixel and a second anode located in the second sub-pixel;

forming a hole transport layer on one side of the anode layer away from the base substrate, the hole transport layer comprising a first hole transport layer located in the first sub-pixel and a second hole transport layer located in the second sub-pixel;

forming a buffer layer on one side of the hole transport layer away from the base substrate, the buffer layer comprising at least one of a first buffer layer located in the first sub-pixel or a second buffer layer located in the second sub-pixel;

forming a light-emitting layer on one side of the buffer layer away from the base substrate, the light-emitting layer comprising a first light-emitting layer located in the first sub-pixel and a second light-emitting layer located in the second sub-pixel, wherein Highest Occupied Molecular Orbital (HOMO) energy level difference between the first light-emitting layer and the first hole transport layer is a first difference greater than 0, and an absolute value of HOMO energy level difference between the second light-emitting layer and the second hole transport layer is a second difference greater than 0 and smaller than the first difference; and forming a cathode on one side of the light-emitting layer away from the anode layer, wherein:

the first buffer layer comprises a plurality of first buffer sub-layers, and HOMO energy level of each of the plurality of first buffer sub-layers is located between HOMO energy level of the first light-emitting layer and HOMO energy level of the first hole transport layer, and HOMO energy levels of the plurality of first buffer sub-layers gradually increase in a direction from the first hole transport layer to the first light-emitting layer, HOMO energy level of the second buffer layer is located between HOMO energy level of the second light-emitting layer and HOMO energy level of the second hole transport layer, and HOMO energy level difference between the second light-emitting layer and the second buffer layer is a third difference, and HOMO energy level difference between the second buffer layer and the second hole transport layer is a fourth difference, wherein one of the third difference and the fourth difference is greater than or equal to 0.3 eV, and a branched chain of each of the plurality of first buffer sub-layers contains a first electron donating group, and a branched chain of each of the second buffer layer contains one of a second electron donating group and an electron withdrawing group, wherein an electron donating ability of the second electron donating group is greater than an electron donating ability of the first electron donating group.

18. The manufacturing method of claim 17, wherein the plurality of sub-pixels further comprises a third sub-pixel, wherein:

the anode layer further comprises a third anode located in the third sub-pixel;

the hole transport layer further comprises a third hole transport layer located in the third sub-pixel;

the buffer layer further comprises a third buffer layer located in the third sub-pixel; and the light-emitting layer further comprises a third light-emitting layer located in the third sub-pixel, and HOMO energy level difference between the third light-emitting layer and the third hole transport layer is a fifth difference greater than 0 and smaller than the first difference, wherein HOMO energy level of the third buffer layer is located between HOMO energy level of the third light-emitting layer and HOMO energy level of the third hole transport layer, HOMO energy level difference between the third light-emitting layer and the third buffer layer is a sixth difference, and HOMO energy level difference between the third buffer layer and the third hole transport layer is a seventh difference, wherein one of the sixth difference and the seventh difference is greater than or equal to 0.3 eV.

19. The manufacturing method according to claim 17, wherein the first sub-pixel is a blue sub-pixel, and the second sub-pixel is one of a red sub-pixel and a green sub-pixel.

20. The manufacturing method according to claim 18, wherein:

the one of the third difference and the fourth difference is smaller than or equal to 0.7 eV; and the one of the sixth difference and the seventh difference is smaller than or equal to 0.7 eV.

\* \* \* \* \*